United States Patent
Liang et al.

(10) Patent No.: US 9,978,442 B2
(45) Date of Patent: May 22, 2018

(54) LOWER POWER HIGH SPEED DECODING BASED DYNAMIC TRACKING FOR MEMORIES

(71) Applicant: QUALCOMM Incorporated, San Diego, CA (US)

(72) Inventors: Bin Liang, San Diego, CA (US); Tony Chung Yiu Kwok, Irvine, CA (US); Rui Li, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/258,964

(22) Filed: Sep. 7, 2016

(65) Prior Publication Data
US 2018/0068714 A1 Mar. 8, 2018

(51) Int. Cl.
| G11C 11/4076 | (2006.01) |
| G11C 7/14 | (2006.01) |
| G11C 11/418 | (2006.01) |
| G11C 11/419 | (2006.01) |
| G11C 7/10 | (2006.01) |
| G11C 13/00 | (2006.01) |

(52) U.S. Cl.
CPC .......... G11C 11/418 (2013.01); G11C 11/419 (2013.01); *G11C 7/1072* (2013.01); *G11C 13/0061* (2013.01)

(58) Field of Classification Search
CPC ... G11C 11/418; G11C 11/419; G11C 7/1072; G11C 13/0061
USPC ................ 365/154, 230.06, 194, 233.1, 198; 711/167
See application file for complete search history.

(56) References Cited

U.S. PATENT DOCUMENTS

| 4,110,842 | A | * | 8/1978 | Sarkissian | ........... | G06F 13/4243 |
| | | | | | | 326/82 |
| 5,592,684 | A | * | 1/1997 | Gaskins | ............. | G06F 13/4059 |
| | | | | | | 710/1 |
| 5,805,873 | A | * | 9/1998 | Roy | ........................ | G11C 5/066 |
| | | | | | | 713/502 |
| 6,128,247 | A | * | 10/2000 | Koshikawa | ............. | G11C 8/18 |
| | | | | | | 365/193 |
| 6,684,298 | B1 | * | 1/2004 | Dwarkadas | ......... | G06F 12/0864 |
| | | | | | | 365/185.13 |

(Continued)

FOREIGN PATENT DOCUMENTS

WO  2008052130 A1  5/2008

OTHER PUBLICATIONS

International Search Report and Written Opinion—PCT/US2017/046616—ISA/EPO—dated Nov. 14, 2017.

*Primary Examiner* — Ly D Pham
(74) *Attorney, Agent, or Firm* — Arent Fox, LLP and Qualcomm

(57) ABSTRACT

A memory is disclosed. The memory includes a memory array having a plurality of memory cells. The memory also includes an address decoder configured to assert a wordline to enable the memory cells. Additionally, the memory includes a tracking circuit configured to vary a duration of asserting the wordline as a function of which one of the memory cells is accessed. A method is also disclosed. The method includes asserting a wordline to enable the memory cells and varying a duration of asserting the wordline as a function of which one of a plurality of memory cells is accessed.

13 Claims, 9 Drawing Sheets

(56) References Cited

U.S. PATENT DOCUMENTS

| | | | |
|---|---|---|---|
| 7,646,658 B2 | 1/2010 | Chen et al. | |
| 8,315,085 B1* | 11/2012 | Chang | 365/154 |
| 8,773,927 B2 | 7/2014 | Evans et al. | |
| 8,787,099 B2 | 7/2014 | Evans et al. | |
| 8,811,070 B1* | 8/2014 | Rai | G11C 11/419 |
| | | | 365/154 |
| 8,976,614 B2 | 3/2015 | Zhang | |
| 2003/0058698 A1* | 3/2003 | Mueller | G11C 5/025 |
| | | | 365/200 |
| 2004/0000951 A1* | 1/2004 | Stengel | H03F 3/605 |
| | | | 330/286 |
| 2007/0008771 A1 | 1/2007 | Lee et al. | |
| 2007/0014142 A1* | 1/2007 | Ng | G11C 17/12 |
| | | | 365/94 |
| 2007/0079219 A1* | 4/2007 | Nagai | G06F 11/106 |
| | | | 714/763 |
| 2008/0123387 A1 | 5/2008 | Imai | |
| 2012/0075924 A1* | 3/2012 | Kau | G11C 13/0004 |
| | | | 365/163 |
| 2012/0224405 A1* | 9/2012 | Tanaka | G11C 8/08 |
| | | | 365/72 |
| 2013/0329505 A1* | 12/2013 | Yang | G11C 7/12 |
| | | | 365/189.11 |
| 2013/0343139 A1* | 12/2013 | Evans | G11C 8/08 |
| | | | 365/194 |
| 2014/0050038 A1* | 2/2014 | Chen | G11C 29/023 |
| | | | 365/193 |
| 2015/0067290 A1* | 3/2015 | Chaba | G06F 13/1689 |
| | | | 711/167 |
| 2016/0086657 A1 | 3/2016 | Hong | |

\* cited by examiner

LOWER POWER HIGH SPEED DECODING BASED DYNAMIC TRACKING FOR MEMORIES

BACKGROUND

Field

The present disclosure relates generally to memory systems, and more particularly, to a dynamic tracking for memories.

Background

Compiler memory tracking may mimic critical path access time in a memory array. Such compiler memory tracking may be a tracking scheme that is conservative in that the worst case, e.g., the longest path, is tracked. With such compiler memory tracking, while the read and write margins for the worst case are tracked, only rows with the longest paths may require the worst case margin. Accordingly, with such compiler memory tracking, unnecessary margin may be provided while accessing rows other than the rows with the longest paths. Additionally, such a compiler memory tracking scheme may consume more power than necessary because, when accessing other rows, e.g., with shorter paths, bitlines and sense amplifier inputs may discharge more than necessary. Accordingly, the bitlines and sense amplifiers may need more power to restore the bitlines and sense amplifier before the next memory access.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. The summary's sole purpose is to present some concepts of one or more aspects in a simplified form as a prelude to the more detailed description that is presented later.

In an aspect of the disclosure, a method, and an apparatus are provided. The apparatus may be a memory. The memory includes a memory array having a plurality of memory cells. Additionally, the memory includes an address decoder configured to assert a wordline to enable the memory cells. The memory also includes a tracking circuit. The tracking circuit is configured to vary a duration of the asserted wordline as a function of which memory cell of the plurality of memory cells is accessed.

The apparatus may be an address decoder. The address decoder includes a wordline assertion circuit configured to assert a wordline to enable the memory cells. The address decoder includes a tracking circuit. The tracking circuit is coupled to the wordline assertion circuit and configured to vary a duration of the asserted wordline as a function of which memory cell of the plurality of memory cells is accessed.

The apparatus may be a processing system. The processing system may include at least one processor. Additionally, the processing system may also include a memory array coupled to the at least one processor. The memory array may have a plurality of memory cells. The processing system also includes an address decoder configured to assert a wordline to enable the memory cells. Additionally, the processing system includes a tracking circuit configured to vary the duration of the asserted wordline as a function of which cell of the plurality of memory cells is accessed.

The method may be performed by a memory. The method includes asserting a wordline to enable the memory cells. Additionally, the method includes varying a duration of the asserted wordline as a function of which cell of a plurality of memory cells is accessed.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
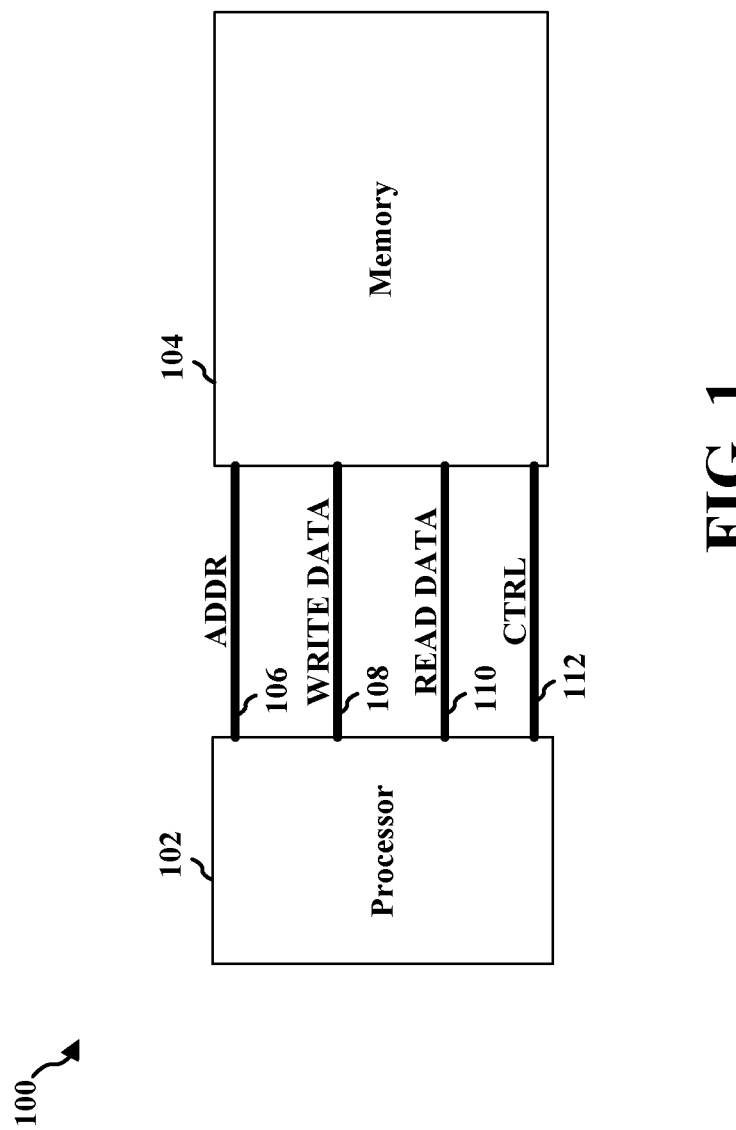
FIG. 1 is a conceptual block diagram illustrating an example of a processing system.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. Acronyms and other descriptive terminology may be used merely for convenience and clarity and are not intended to limit any concept disclosed herein.

Various memories presented throughout this disclosure may be implemented in a stand-alone memory. Such aspects may also be included in an integrated circuit (IC) or system, or a portion of an integrated circuit or system (e.g., modules, components, circuits, or the like residing in an integrated circuit or part of an integrated circuit), or an intermediate product where an integrated circuit or system is combined with other integrated circuits or systems (e.g., a video card, a motherboard, etc.) or an end product (e.g., mobile phone, personal digital assistant (PDA), desktop computer, laptop computer, palm-sized computer, tablet computer, work station, game console, media player, computer based simulators, wireless communication attachments for laptops, or the like).

The word "exemplary" is used herein to mean serving as an example, instance, or illustration. Any embodiment described herein as "exemplary" is not necessarily to be construed as preferred or advantageous over other embodiments. Likewise, the term "embodiment" of an apparatus does not require that all embodiments of the invention include the described components, structure, features, functionality, processes, advantages, benefits, or modes of operation.

The terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements may be physical, logical, or a combination thereof. As used herein, two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Any reference to an element herein using a designation such as "first," "second," and so forth does not limit the quantity or order of those elements. Rather, these designations are used herein as a convenient method of distinguishing between two or more elements or instances of an element. Thus, a reference to first and second elements does not mean that only two elements can be employed, or that the first element must precede the second element. As used herein, references to the plural include the singular, and references to the singular include the plural.

Various aspects of a memory will now be presented in the context of a static random access memory (SRAM). SRAM is volatile memory that requires power to retain data. However, as those skilled in the art will readily appreciate, such aspects may be extended to other memories and/or circuit configurations. Examples of other memories may include random access memory (RAM), dynamic RAM (DRAM), synchronous dynamic RAM (SDRAM), double data rate RAM (DDRAM), read only memory (ROM), programmable ROM (PROM), erasable PROM (EPROM), electrically erasable PROM (EEPROM), a general register on a processor, flash memory, or any other suitable memory. Accordingly, while SRAM may be used in various examples described herein, references to SRAM are intended to illustrate exemplary aspects of other memory types in addition to SRAM. For example, aspects described with respect to SRAM may be applied RAM, DRAM, SDRAM, DDRAM, ROM, PROM, EPROM, OR EEPROM, to name a few, with the understanding that such aspects may be extended to a wide range of applications.

FIG. 1 is a conceptual block diagram illustrating an example of a processing system 100. The processing system 100 includes a processor 102 and a memory 104. The processor 102 may be a microprocessor, microcontroller, digital signal processor (DSP), programmable logic implementing a processor, or other processing circuitry. The memory 104 may be a multibank memory, such as a synchronous dynamic random access memory (SDRAM), or any other multibank component capable of retrieving and storing information.

The processor 102 illustrated in FIG. 1 is connected to the memory 104. The connections between the processor 102 and the memory 104 may include an address bus 106, a write data bus 108, a read data bus 110, and a control bus 112. The write data bus 108 may be used to write data from the processor 102 to the memory 104. The control bus 112 may include signals used to control the writing of data from the processor 102 to the memory 104. The read data bus 110 may be used to read data from the memory 104 to the processor 102. The control bus 112 may include signals used to control the reading of data from the memory 104 to the processor 102. For example, the control bus 112 may include signals such as a read signal and a write signal. The read signal may be a single signal line, e.g., a single bit, that indicates when the memory is being read by the processor 102. The write signal may be a single signal line that indicates when the memory is being written by the processor 102. In some examples, the control bus 112 may also include a byte enable signal. The byte enable signal may be a group of signal lines that indicate the size of the data, e.g., 8, 16, 32, 64 bytes. In some examples, however, the size of the data may be fixed, e.g., one of 8, 16, 32, 64 bytes. Accordingly, the byte enable signal may be optional on the control bus 112.

Other optional signals that may be part of the control bus 112 may include, but are not limited to, transfer acknowledgment (ACK), bus request, bus grant, interrupt request, one or more clock signals, and a reset signal. The transfer acknowledge signal may indicate that data is acknowledged by a device, e.g., the processor 102, as having been read. The bus request may indicate that a device, e.g., the processor 102 or the memory 104 is requesting the bus, e.g., the processor 102 or the memory 104 is requesting use of the address bus 106 and one of the write data bus 108 or the read data bus 110. The bus grant may indicate that the processor 102 has granted access to the bus. The interrupt request may indicate to the processor 102 that a lower priority device is requesting the bus. Any clock signals on the control bus 112 may be used to synchronize devices on the control bus 112 such as the processor 102, the memory 104, or both. The reset may be used to reset the processor 102, the memory 104, or both. The signals described above as optional may not be used in the example systems described herein, but may be used in a particular implementation of the systems and methods described.

The control bus 112 may include a read signal and a write signal. The read signal and the write signal may be used to generate a read enable and a write enable, respectively, within the memory 104 as will be discussed in greater detail with respect to FIG. 3.

The address bus 106 may be used to indicate which location within the memory 104 the processor is reading or writing. For example, if the processor 102 wishes to read a memory location in the memory 104 the processor 102 may output the address of the memory location on the address bus 106. Additionally, the processor 102 may drive the read signal, which may be part of the control bus 112, active. The memory 104 may then output the data in the memory location indicated by the address bus 106 on the read data bus 110. Similarly, if the processor 102 wishes to write a memory location in the memory 104, the processor may output the address of the memory location to be written on the address bus 106. Additionally, the processor 102 may drive the write signal, which may be part of the control bus 112, active. The processor 102 may drive the write data bus 108 with the data that is to be written to the memory 104.

The write data bus 108 and the read data bus 110 are illustrated as separate buses in FIG. 1. It will be understood however, that in other examples a single bidirectional data bus may be used to write data from the processor 102 to the memory 104 and to read data from the memory 104 to the processor 102. Systems using a single bidirectional data bus may be used to write data from the processor 102 to the memory 104 and to read data from the memory 104 to the processor 102 may include various control signals to allow for the use of a single bidirectional data bus, such as a read/write signal and a data valid signal. The read/write signal may indicate when data is being read or written. The data valid signal may indicate if data on the bidirectional data bus is valid data.

Figure 2:
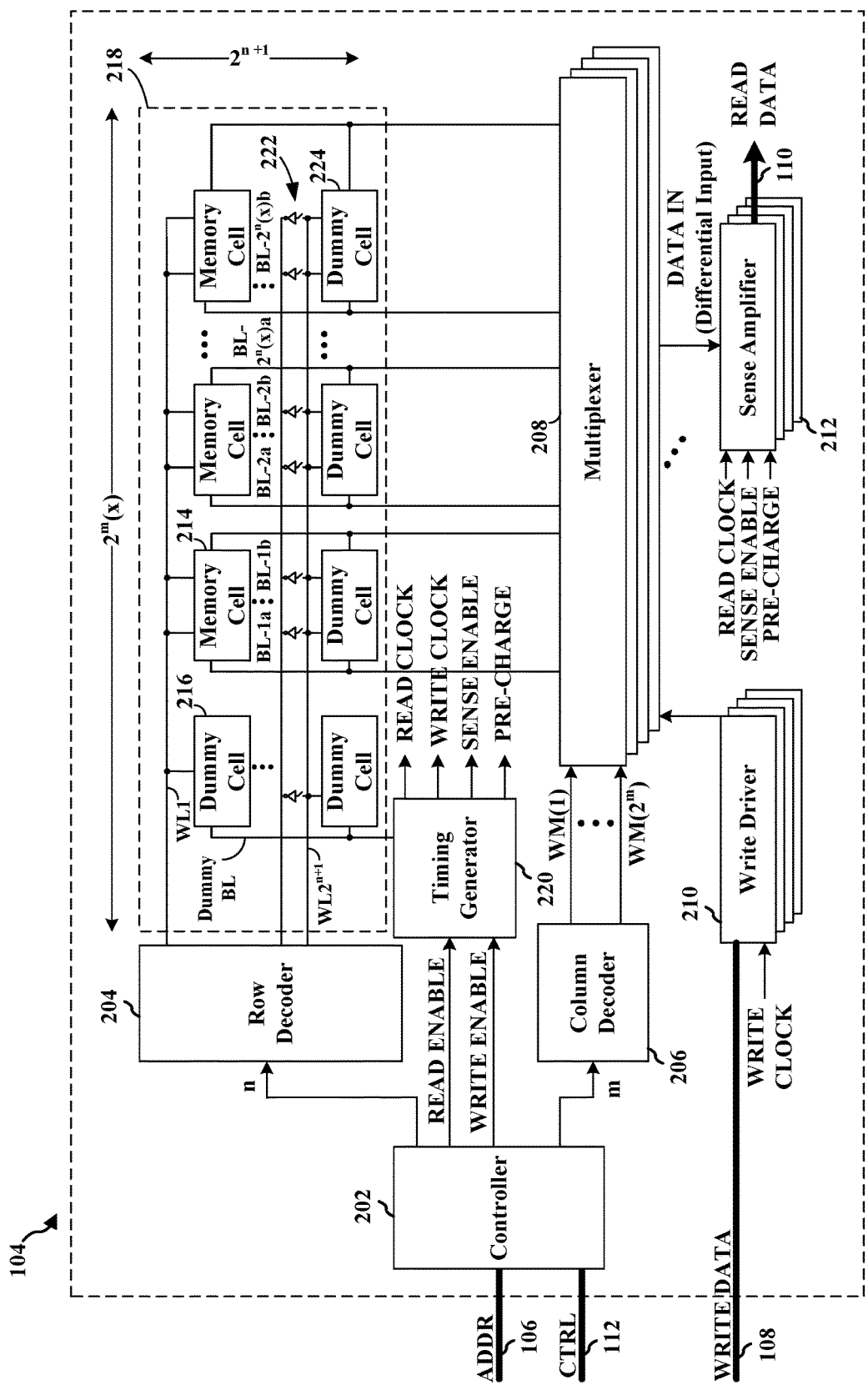
FIG. 2 is a functional block diagram of an exemplary embodiment of an SRAM.

FIG. 2 is a functional block diagram of an exemplary embodiment of a memory 104. The memory bank may be a static random-access memory (SRAM). The memory 104 may include a memory array 218 with supporting circuitry to decode addresses and perform read and write operations. The memory array 218 may be comprised of memory cells 214 for storing data. For example, the memory cell 214 may be a bit cell storing a bit of data. Accordingly, a memory cell such as memory cell 214 in memory 104 may provide a means for storing a first bit. Similarly, another memory cell, generally in another memory bank, may provide a means for storing a second bit.

The memory cell 214 may be arranged to share connections in horizontal rows and vertical columns. Specifically, each horizontal row of memory cells 214 may share a wordline WL, and each vertical column of memory cells 214 may share a pair of bitlines (e.g., BL-1a and BL-1b). The size of the memory array 218 (e.g., the number of cells) may vary depending on a variety of factors including the specific application, the speed requirements, die layout constraints and testing requirements, and the overall design constraints imposed on the system. The memory array 218 may contain thousands or millions of memory cells.

In the exemplary embodiment of the memory 104 shown in FIG. 2, the memory array 218 may include (2n·2m(x)) memory cells 214 arranged in 2n horizontal rows and 2m(x) vertical columns, where 2m is the number of words per row and x is the number of bits per word. A peripheral device (not shown) may randomly access any word (i.e., x cells) in the memory array 218 using an (n+m) bit wide address that is provided through a controller 202 to a row decoder 204 and column decoder 206, respectively. As will be described in greater detail later, the controller 202 may be responsible for the memory read and write operations. For example, the controller may provide the timing for the read and write operations in memory a cycles. The output from the controller 202 may include an n-bit address provided to the input of a row decoder 204, and an m-bit address provided to the input of a column decoder 206. The column decoder 206 provides 2m outputs (WM(1)-WM(2m)) with a different one of the outputs asserted for each different combination of address inputs.

The outputs are provided to x multiplexers 208. For a write memory access, each multiplexer is a 2m:1 multiplexer which switches one of x inputs from a write driver 210 between 2m bitline pairs based on the outputs from the column decoder 206. By way of example, a memory array that stores four (4) 128-bit words per row requires 128 4:1 multiplexers. Each multiplexer input is coupled to, for example, one of 128 outputs from the write driver 210. Based on the decoded m-bit address, each multiplexer input may be coupled from the write driver 210 to one of 4 bitline pairs. The 4 bitline pairs may be coupled to four memory cells, each storing a corresponding bit for a different word in a row. For example, the first of the 4 memory cells may store the least significant bit (LSB) of the first word, the second of the 4 memory cells may store the LSB of the second word, the third of the 4 memory cells may store the LSB of the third word, and the fourth of the 4 memory cells may store the LSB of the fourth word.

Thus, when the WRITE ENABLE signal from the controller 202 is asserted, the write driver 210 outputs the Write Data received from the peripheral device (not shown) to x pairs of bitlines BL-a and BL-b with each of the x multiplexers driving one pair of bitlines (e.g., BL-1a and BL-1b). The row decoder 204 converts the n-bit address into 2n wordline outputs. A different wordline WL is asserted by the row decoder 204 for each different n-bit row address. As a result, each of the 2m(x) memory cells 214 in the horizontal row with the asserted wordline WL is connected to one pair of the 2m(x) bitlines (e.g., BL-1a and BL-1b) through each memory cells 214 access transistors, as will be described in more detail below with reference to FIG. 3. The write data is driven, through the x multiplexers 208, onto the selected pairs of bitlines (e.g., BL-1a and BL-1b) and written to the memory cells with the asserted wordline WL.

For a read memory access, the row decoder 204 converts the n-bit address into one of the 2n read wordlines. A different read wordline WL is selected by the row decoder 204 for each different n-bit row address. As a result, each of the 2m(x) memory cells in the horizontal row with the selected read wordline WL is connected to one of the 2m(x) read bitlines BL through the memory cell's access transistor, as will be described in more detail below with reference to FIG. 3. The 2m(x) read bitlines BL are used to transmit the bits stored by the 2m(x) memory cells to the x multiplexers 208, with each multiplexer 208 selecting one bit from the 2m bits transmitted on the read bitlines BL to the input of that multiplexer 208. The selected bits from the x multiplexers 208 are provided to the sense amplifier 212 for outputting the read data signal 230. Accordingly, a sense amplifier, such as the sense amplifier 212 in memory 104 may provide a means for generating a first data bit output as a function of the first bit when a first read enable is active. Another sense amplifier, generally in another memory bank, may provide a means for generating a second data bit output as a function of the first bit when a first read enable is active. After the READ ENABLE signal generated by the controller 202 is asserted, the selected bits are ready for the sense amplifier 212. The READ ENABLE from the controller 202 may be used to generate the READ CLOCK. Additionally, the controller 202 may generate the n and m signals for the row and column decoders, respectively. Data from the multiplexer 208 into the sense amplifier 212 (DATA IN) may be available after the bitline BL and the wordline WL are selected, e.g., based on the n and m signals, and after the READ CLOCK is generated. Generally, there may be a delay from when the bitline BL and the wordline WL and the READ CLOCK are selected and when data from the multiplexer 208 into the sense amplifier 212 (DATA IN) is available because accessing the memory and propagating through the multiplexer 208 may take time.

As mentioned earlier, the controller 202 is responsible for memory operation by providing the timing for the read and write operations in a memory cycle. The memory cycle may be defined by the SYSTEM CLOCK input to the controller 202. The timing of the read and write operation is derived from internal READ and WRITE CLOCKS that are used to respectively multiplex READ and WRITE ADDRESS inputs from a peripheral device to the address decoder (i.e., row decoders 204 and column decoders 206). The READ clock is set by the READ ENABLE and reset by the READ CLOCK RESET. Similarly, the WRITE CLOCK is set by the WRITE ENABLE once the read operation is complete and reset by the WRITE CLOCK RESET. The READ and WRITE ENABLES may be input to the controller 202 from a peripheral device and controlled by the peripheral device. The READ CLOCK and WRITE CLOCK RESET may be generated by a tracking circuit in the memory array 218 and input to the controller 202. The READ ENABLE may be used to generate the READ CLOCK. The WRITE ENABLE may be used to generate the WRITE CLOCK. The READ CLOCK may be generated by the timing generator 220. The timing generator 220 may be configured to control the timing of the READ CLOCK so that the sense amplifier 212 is active when the DATA IN signal(s) are valid. Similarly, the timing generator 220 may be configured to control the timing of the WRITE CLOCK so that the Write Driver 210 is active when the DWRITE DATA signal(s) are valid.

As used herein, the terms "set" and "reset" with respect to a clock or other signal may describe two different logic states of such clock or other signal regardless of polarity. By way of example, a clock or other signal may be described as having a high logic state (e.g., a logic level "1") when set and a low logic state (e.g., logic "0") when reset. Alternatively, the clock or other signal may be described as having a low logic state when set and a high logic state when reset, as might be the case with an inverted clock or signal. Accordingly, the terms "set" and "reset" as used herein shall have no defined polarity, but rather shall be construed broadly to mean different logic states with reference to one another.

In the described exemplary embodiment, the tracking circuit may include a column of dummy cells, e.g., such as the example dummy cell 216, in the memory array. Dummy cells, such as dummy cell 216, may be used to determine when data from a memory cell, such as memory cell 214, is valid. Each dummy cell 216 may be configured to emulate the operation of a row of memory cells 214. Each dummy cell 216 is connected to the same WL for the dummy cell's 216 row of memory cells 214. (Accordingly, there may be a dummy cell for each row so that each row may be monitored based on that row's dummy cell, e.g., dummy cell 216.) A timing generator 220 may be used to monitor the dummy bit line (BL) from the dummy cell 216 connected to the asserted WL. Specifically, the timing generator 220 may monitor the dummy BL and compare a voltage on the dummy BL to a threshold to track the access time of the selected memory cell 214 during read and/or write operations.

By way of example, during a read operation, the timing generator 220 monitors the dummy BL and may reset the READ CLOCK when a known bit stored in the dummy cell 216 appears on the dummy BL. (For example, the timing generator 220 may monitor the dummy BL to determine when the dummy BL changes from one logic state (e.g., a logic 1 state) to another logic state (e.g., a logic 0 state). The change in logic state may indicate that data on the corresponding memory cell bit lines is valid.) Similarly, during a write operation, the timing generator 220 monitors the dummy BL and resets the WRITE CLOCK when a known bit written to the dummy cell by the write driver 210 appears on the dummy BL. (For example, the timing generator 220 may monitor the dummy BL to determine when the dummy BL changes from one logic state to another logic state. The change in logic state may indicate that data on the corresponding memory cell bit lines is valid.) In at least one exemplary embodiment, the timing generator 220 may also be used to generate a WRITE READY signal. The WRITE READY signal may be used by the controller to satisfy certain internal timing constraints of the write operation following the read operation. Each memory cell 214 may be configured to store one bit of data (e.g., a logic level "1" or a logic level "0").

The conceptual block diagram 200 of FIG. 2 also includes wordline tracking circuitry 222 connected to a series of dummy memory cells 224. The dummy memory cells 224 run along the length of a wordline tracking signal line. The wordline tracking circuitry 222 includes a wordline tracking signal line, one or more switches, one or more inverters and a wordline tracking signal return line. The wordline tracking signal line is coupled to the one or more switches. The one or more switches are each coupled to one of the one or more inverters. The output of the one or more inverters are coupled to the wordline tracking signal return line. The switches may be controlled by the bitlines. Accordingly, tracking may be accomplished using dummy cells 224 to simulate a delay of certain memory cells which are grouped together based on similar path lengths. The groups of cells may make up a single row or groups of rows. Groups of rows may be tracked together. The dummy cells 224 and corresponding memory cell may be accessed based on the bitline used to access a particular memory address. The switches and inverters may be controlled by the bitlines. For example, each bitline may control a switch. The tracking signal may be fed back through the switch selected by the bitline and through the corresponding inverter (or buffer). Accordingly, the bitlines may select how long the feedback path is for feedback path, e.g., the wordline $WL^{2n+1}$.

Figure 4:
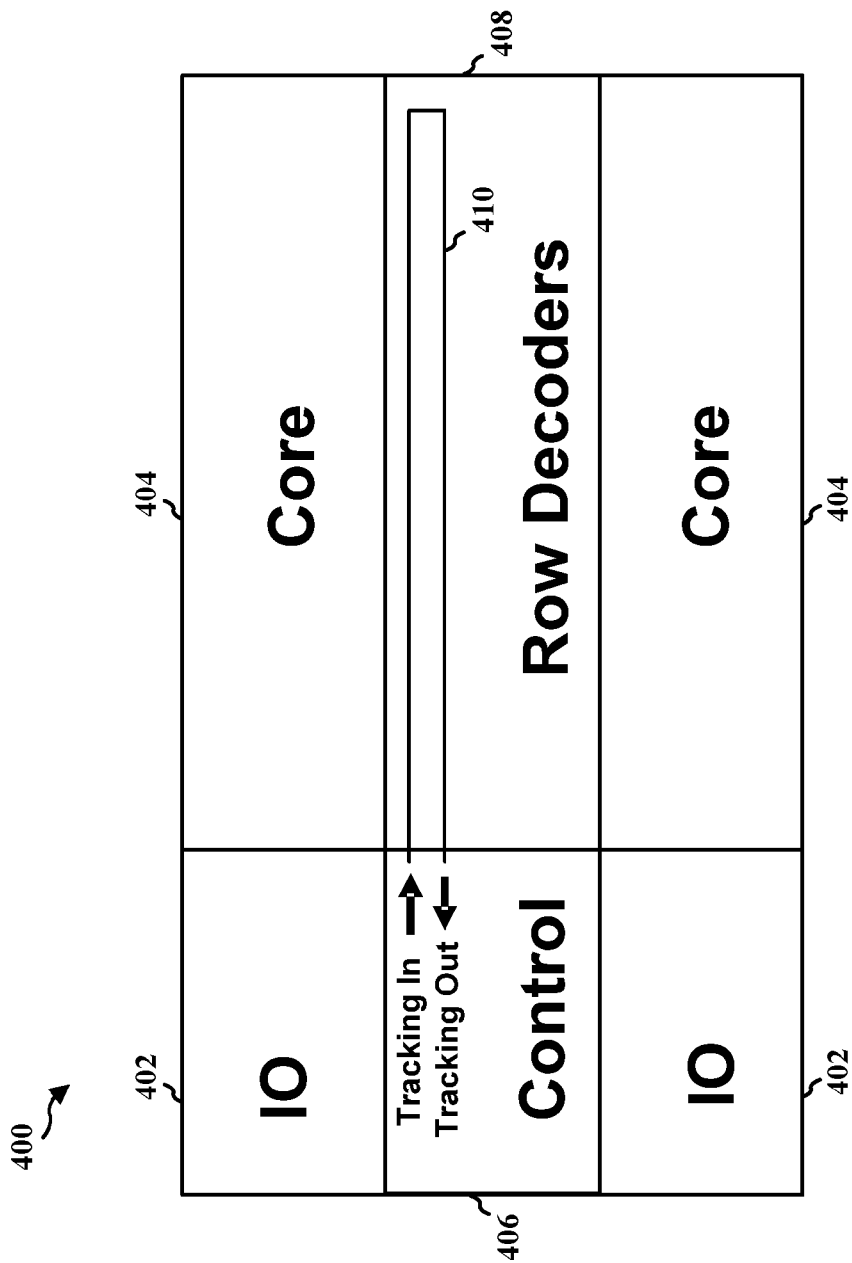
FIG. 4 is a block diagram illustrating an example memory tracking system.
Figure 5:
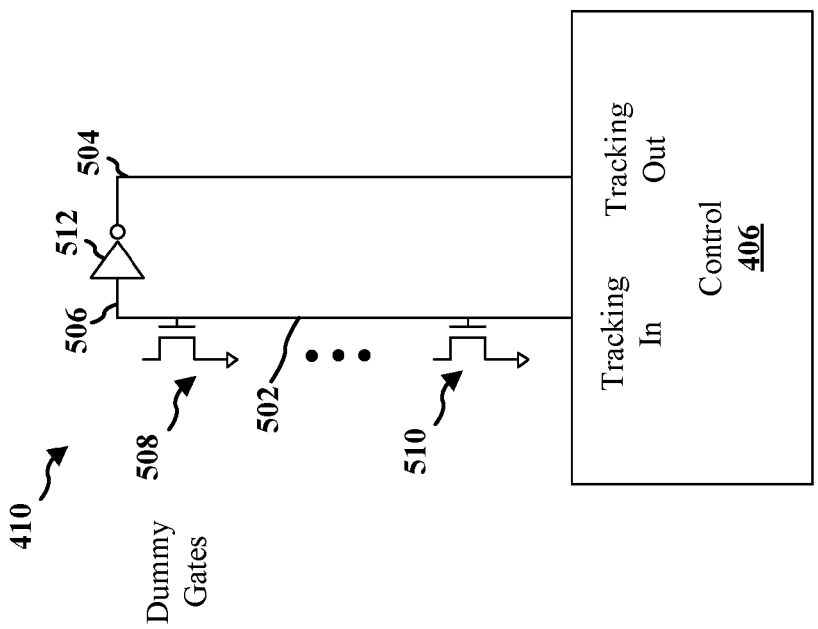
FIG. 5 is a circuit diagram illustrating an aspect of the example memory tracking system of FIG. 4.

In some examples, the wordline tracking circuitry may provide a worst case tracking scheme that may track a wordline based on a longest path, as described with respect to FIGS. 4 and 5. In other examples, the wordline tracking circuitry 222 may provide a dynamic tracking scheme, as described with respect to FIGS. 2 and 6-9. As illustrated in FIG. 2, a dynamic tracking scheme may provide tracking that depends on the row being accessed rather than depending on the longest path, which may be the worst case delay due to the length of the longest path. The longest path may have the longest path delay. While the non-dynamic tracking scheme may depend on the longest path delay, the dynamic tracking scheme may depend on the length of the row being accessed rather than the longest path.

Figure 3:
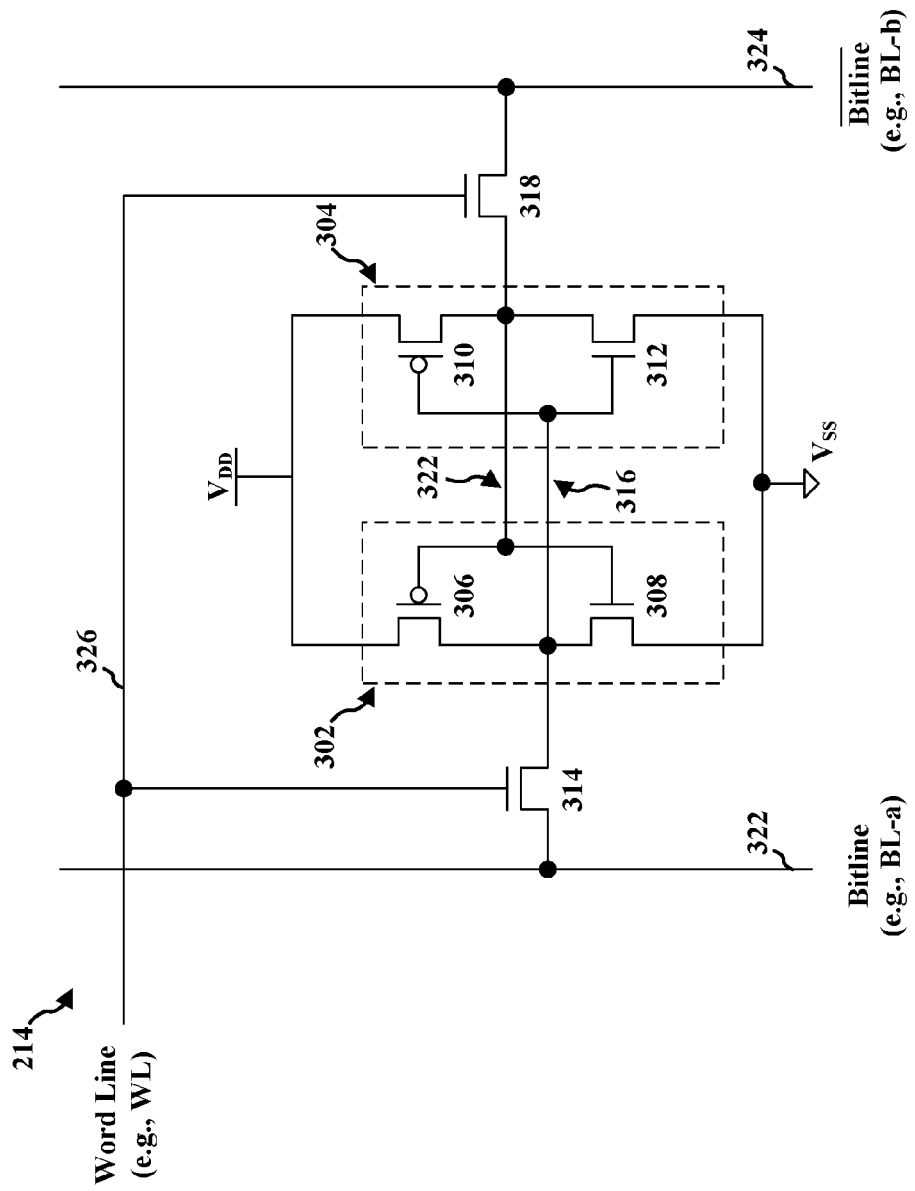
FIG. 3 is a schematic diagram of an exemplary embodiment of a memory cell for an SRAM.

FIG. 3 is a schematic diagram of an exemplary embodiment of the memory cell 214 of FIG. 2 of a memory bank, e.g., memory 104 of FIG. 2. The memory cell 214 illustrated in FIG. 3 is a six-transistor (6T) configuration. However, as those skilled in the art will readily appreciate, the memory cell 214 may be implemented with a four-transistor (4T) configuration, an eight transistor (8T) configuration, a ten transistor (10T) configuration, or any other suitable transistor configuration that may be used to implement a memory cell.

The memory cell 214 is shown with two inverters 302, 304. The first inverter 302 comprises a p-channel metal-oxide-semiconductor field effect (PMOS) pull-up transistor 306 and an n-channel metal-oxide-semiconductor field effect (NMOS) 308. The second inverter 304 comprises a PMOS pull-up transistor 310 and an NMOS transistor 312. In the described embodiment, the inverters 302 and 304 are powered by VDD and have a return VSS (e.g., ground). The first inverter 302 and the second inverter 304 are interconnected to form a cross-coupled latch. A first NMOS access transistor 314 couples the output node 316 from the second inverter 304 to a bitline BL-a 322, and a second NMOS access transistor 318 couples the output node 322 from the first inverter 302 to a bitline BL-b 324 (the value of which is the opposite or inverse of the bitline 322). The gates of the NMOS access transistors 314, 318 are coupled to a wordline WL 326.

A write operation may be performed by setting the bitlines BL-a 322 and BL-b 324 to the value to be written to the memory cell 214 and asserting the wordline WL 326. The wordline WL 326 may be asserted before the value to be written (e.g., write data) is provided to the bitlines BL-a 322 and BL-b 324. By way of example, a low value, e.g., a logic level "1" may be written to the memory cell 214 by setting the bitline BL-a 322 to a logic level 0 and the bitline BL-b 324 to a logic level "1." The logic level 0 at the bitline BL-a 322 is applied to the inverter 304 through the NMOS access transistor 314, which in turn forces the output node 320 of the second inverter 304 to VDD. The output node 320 of the second inverter 304 is applied to the input of the first inverter 302, which in turn forces the output node 316 of the first inverter 302 to VSS. A logic level 0 may be written to the memory cell 214 by inverting the values of the bitlines BL-a 322 and BL-b 324. The write driver 210 may be designed to be stronger than PMOS pull-up transistors (306 and 310) in the memory cell 214 so that the write driver 210 can override the previous state of the cross-coupled inverters 302, 304.

Once the write operation is complete, the wordline WL 326 is de-asserted, thereby causing the NMOS access transistors 314 and 318 to disconnect the bitlines BL-a 322 and BL-b 324 from the two inverters 302, 304. The cross-coupling between the two inverters 302, 304 maintains the state of the inverter outputs as long as power is applied to the memory cell 214.

The memory cell 214 stores data according to the data values stored at nodes 316 and 322. If the memory cell 214 stores a logic high (i.e., a '1'), then node 316 is at a logic high and node 322 is at a logic low (i.e., a '0'). If the memory cell 214 stores a logic low, then node 316 is at a logic low and node 322 is at logic high. During a read operation, differential bit lines BL-1a and BL-1b may be precharged by a pre-charge circuit. The wordline WL 326 is then asserted, thereby turning on NMOS access transistors 314, 318. The timing between the pre-charging and asserting the wordline WL 326 may be controlled by the row decoder 204.

If memory cell 214 stores a logic high, then bit line BL-1a remains charged via NMOS access transistor 314, and complimentary bit line BL-1b is discharged via NMOS access transistor 318. If memory cell 214 stores a logic low, then bit line BL-1a is discharged via NMOS access transistor 314, and complimentary bit line BL-1b remains charged via NMOS access transistor 318.

As illustrated in FIGS. 4-5, with some memory tracking, e.g., compiler memory tracking, the time to transmit a signal through the entire length of row decoders and back is tracked. The tracking schemes illustrated in FIGS. 4-5 track the worst case delay, e.g., because the tracking schemes illustrated in FIGS. 4-5 use the longest path delay for all memory accesses from memory accesses having the shortest path delay to memory accesses having the longest path delay. Regardless of the path delay for a particular memory access, a delay for an access associated with a longest path is used.

FIG. 4 is a block diagram illustrating an example memory tracking system 400. The example memory tracking system 400 includes input/output (IO) 402 and memory cores 404. The example memory tracking system 400 also includes control 406 and a series of row decoders 408. The example memory tracking system 400 also includes wordline tracking circuitry 410.

The IO 402 may provide input to the memory cores 404 and output from the memory cores 404. Accordingly, the IO 402 may allow the memory cores 404 to be read and/or written. The memory cores 404 may provide data storage. Digital data may be written and read from the memory cores 404. The data stored in the memory core 404 may be written to the memory core 404 through the IO 402. Additionally, the data stored in the memory core 404 may be read from the memory core 404 through the IO 402.

The control 406 may control the reading and/or writing of data to and/or from the memory core 404 based on address information and tracking information. The tracking information may be generated using wordline tracking circuitry 410. The wordline tracking circuitry 410 may be used to determine a duration of an asserted wordline as a function of a farthest memory cell that may be accessed. For example, the wordline tracking circuitry 410 may send a tracking in signal along a signal path parallel to a series of wordlines. The tracking in signal may function as a wordline for a series of dummy cells or a series of dummy gates. The series of dummy cells or the series of dummy gates allow for the timing along the signal path of the wordlines to be estimated. For example, the time for a signal to propagate along a wordline may be the same as the time for a signal to propagate along the tracking in signal. In FIG. 4, the tracking in signal may be connected to a farthest dummy cell or dummy gate. The tracking in signal may then return along a tracking out signal path. The tracking out signal may be an inverted or buffered version of the tracking in signal. In some examples, the control 406 may maintain an active wordline signal from the time that the tracking in signal is activated to the time the tracking out signal is received.

For example, assume an inverter is used to buffer between the tracking in signal and the tracking out signal. The tracking in signal and the wordline may begin in an inactive logic level, e.g., a logic state that indicates that the tracking signal or a particular wordline are not active. For example, the wordlines and tracking signal may all be in an inactive logic level when a memory implementing the systems and methods described herein is not being accessed. For example, the wordlines and the tracking in signal may be "active high," e.g., active when at a logic "1" and inactive when at a logic "0." The tracking out signal may also be inactive (but the polarity of the inactive tracking signal may be opposite the polarity of the inactive tracking in signal due to the use of the inverter). In some examples, the tracking in signal and the wordline may be driven active at the same time. After some time, which may correspond to a time for the tracking in signal to reach the farthest gates or cells, the tracking signal may be buffered by the inverter. The inverter may drive the tracking out signal active. After some time, the now active tracking out signal may reach the control 406. The tracking out signal provides feedback that the wordline has reached the cells or gates. Accordingly, the control 406 may drive the wordline and the tracking in signal inactive when the tracking out signal transitions active at the control 406. For example, the tracking in signal may be "active high." The tracking out signal may be "active low" due to the use of an inverter as a buffer. The control 406 may drive the wordline and the tracking in signal inactive, e.g., a logic low for an active low signal, when the tracking out signal transitions active at the control 406, e.g., a logic high because the tracking out signal is active low due to the inverter.

As a more specific example, assume that the wordline and tracking in signal are active when the wordline and tracking in signal are at a logic high. Assume that the tracking out signal is active when at a logic low. Assume that an inverter is used to buffer the tracking in signal. The tracking in signal and the wordline may begin in an inactive state, e.g., the memory is not being accessed The tracking out signal may also be inactive, but at a logic high. The tracking in signal and the wordline may be driven active to logic highs at the same time, e.g., when the memory is being accessed. After some time, which may correspond to a time for the tracking in signal to reach the farthest gates or cells, the tracking signal may transition high at an input to the inverter. The inverter may buffer the tracking in signal. Thus, the inverter may have a logic high input. Accordingly, the inverter may drive the tracking out signal to an active state, e.g., a logic low value. After some time, the active tracking out signal may reach the control 406. Based on the tracking out signal transitioning to an active state at the control 406, the control may drive the wordline and the tracking in signal inactive.

In other examples, the wordline and tracking in signal may be active when the wordline and tracking in signal are logic lows. The tracking out signal may be active when a logic high. In another example, a non-inverting buffer may be used to buffer the tracking in signal. Accordingly, the tracking in signal and the tracking out signal may both share the same active logic state, e.g., both logic high or both logic low.

As discussed above, in some examples, the timing between the tracking in signal and the wordline signals may be the same or approximately the same. For example, the tracking in signal and the wordline signal may be driven active at the same time. In other examples, the timing between the tracking in signal and the wordline signal may vary. For example, the wordline signal may be driven active first to help insure the wordline signal meets timing requirements before being disabled based on the tracking circuitry. In other examples, the tracking in signal may precede the wordline to adjust the return of the tracking out signal to correspond to the wordline signal reaching the farthest cells or gates that the wordline signal may drive to access a memory cell or cells.

FIG. 5 is a circuit diagram illustrating an aspect of the example memory tracking system of FIG. 4. The example memory tracking system includes wordline tracking circuitry 410 and control 406. The example circuit diagram includes a tracking in signal 502 and a tracking out signal 504. The example memory tracking system illustrated in the circuit diagram routes the tracking in signal to a point 506 beyond a farthest gate of dummy gates 508 of the dummy gates 508, 510. At the point 506 the tracking in signal may be buffered by an inverter 512 and output to the tracking out signal line. Accordingly, the tracking out signal 504 may be returned to control 406 of FIG. 4, e.g., the output of the inverter 512 may drive the tracking out signal to the tracking out input of the control 406. The tracking in signal 502 and tracking out signal 504 may each have a particular fixed length. The lengths may generally be similar in some examples.

As discussed above, the control 406 may control the reading and/or writing of data to and/or from the memory core 404 based on address information and tracking information. The tracking information may be generated using wordline tracking circuitry 410. The wordline tracking circuitry 410 may be used to determine a duration of an asserted wordline as a function of a farthest memory cell that may be accessed. For example, the wordline tracking circuitry 410 may send a tracking in signal 502 along a signal path parallel to a series of wordlines in a memory system. The tracking in signal 502 may function as a wordline for a series of dummy cells (see, e.g., FIG. 2) or a series of dummy gates 508, 510. The series of dummy cells or the series of dummy gates 508, 510 allow for the timing along the signal path of the wordlines to be estimated. For example, the time for a signal to propagate along a wordline may be the same as the time for a signal to propagate along the tracking in signal. In FIG. 5, the tracking in signal is connected to the farthest dummy gate 508. The tracking in signal then returns through the inverter 512 along a tracking out signal 504 path. The tracking out signal 504 is an inverted version of the tracking in signal. The path along the tracking in signal, through the inverter 512, and along the tracking out signal is fixed, rather than dynamically changeable. The path is set by the particular layout of an IC implementing the systems and methods described herein.

The examples of memory tracking illustrated in FIGS. 4-5 are not dynamic, however. In other words, the tracking in signal is always connected to the farthest dummy gate 508. Accordingly, memory accesses may take longer than necessary because the memory accesses may be based on the longest delay along the path of a wordline signal. Additionally, the bitlines and sense amplifiers may discharge more than necessary during a memory access due to the increased delay along the path of the longest wordline. During a memory access, precharged voltages on the bitlines and sense amplifiers may discharge. If the memory access is longer than necessary to write and/or read data to a particular address in the memory, the precharged voltages may decrease due to a discharge of the precharge that may be greater than the discharge that would occur if a shorter memory access time allowed for by a dynamic tracking system is used. For example, closer sets of memory cells may be read or written more quickly and therefore may have lower discharges for the precharged signals.

Figure 6:
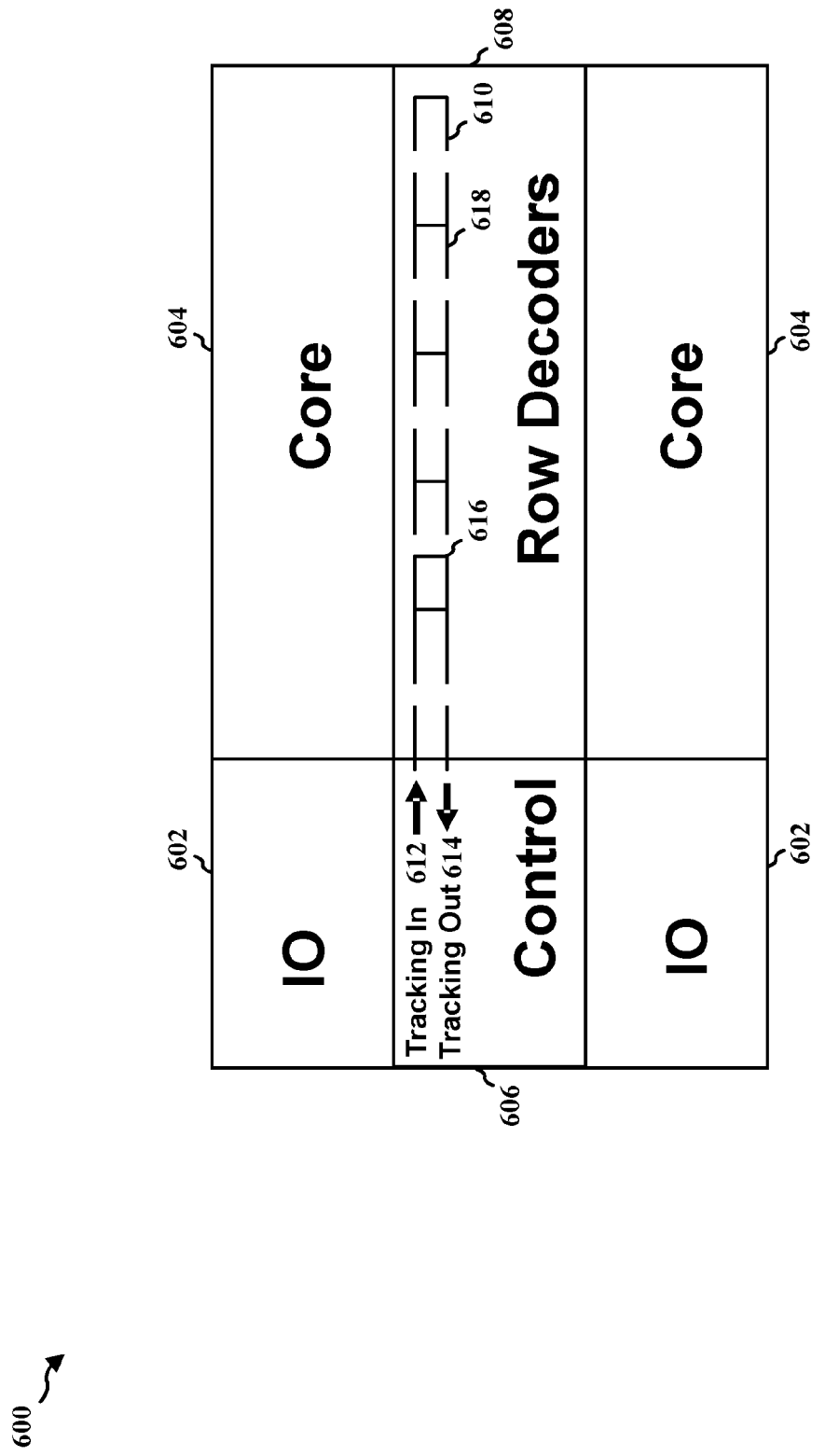
FIG. 6 is a block diagram illustrating an example memory tracking system.
Figure 7:
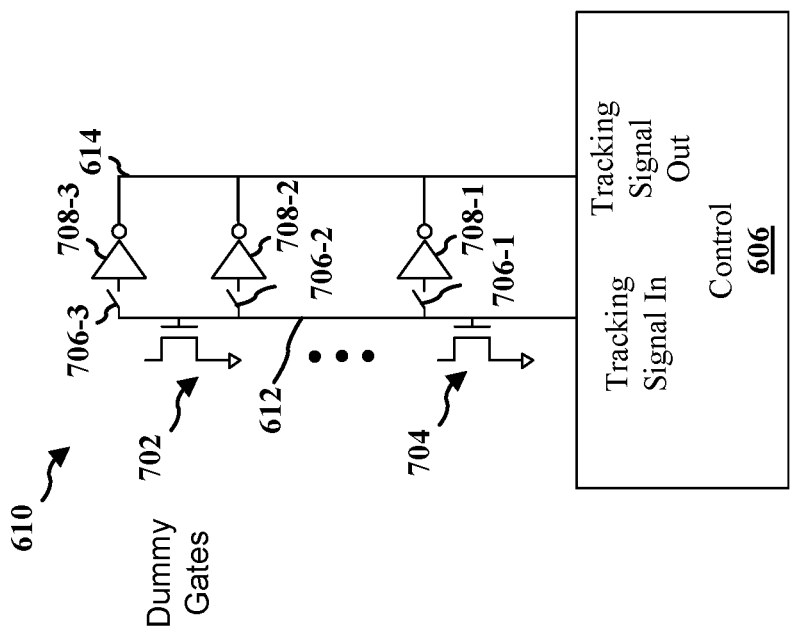
FIG. 7 is a circuit diagram illustrating an aspect of the example memory tracking system of FIG. 6.

A dynamic tracking scheme may provide tracking that depends on the row being accessed rather than depending on the worst case delay along a longest signal path regardless of the length of the signal path for the wordline of the particular memory cell or cells accessed. Accordingly, dynamic tracking may decrease delay for some memory accesses and may decrease unnecessary discharges of precharged signals. FIGS. 6-7, as well as FIG. 2, illustrate example dynamic memory tracking systems.

FIG. 6 is a block diagram illustrating an example memory tracking system 600 using dynamic memory tracking. The example memory tracking system 600 includes IO 602 and memory cores 604. The example memory tracking system 600 also includes control 606 and a series of row decoders 608. The example memory tracking system 600 also includes wordline tracking circuitry 610.

The IO 602 may provide input to the memory cores 604 and output from the memory cores 604. Accordingly, the IO may allow the memory cores 604 to be read and/or written. The memory cores 604 may provide data storage. Digital data may be written and read from the memory cores 604. The data stored in the memory core 604 may be written to the memory core 604 through the IO 602. Additionally, the data stored in the memory core 604 may be read from the memory core 604 through the IO 602.

The control 606 may control the reading and/or writing of data to and/or from the memory core 604 based on address information and tracking information. The tracking information may be generated using wordline tracking circuitry 610. The wordline tracking circuitry 610 may be used to determine a duration of an asserted wordline dynamically as a function of a particular memory cell that may be accessed. For example, the wordline tracking circuitry 610 may send a tracking in signal 612 along a signal path parallel to a series of wordlines. The tracking in signal 612 may function as a wordline for a series of dummy cells or a series of dummy gates. The series of dummy cells or the series of dummy gates allow for the timing along the signal path of the wordlines to be estimated based on a distance to the dummy cells or the dummy gates accessed. For example, the time for a signal to propagate along a wordline may be the same as the time for a signal to propagate along the tracking in signal 612.

In FIG. 6, the tracking in signal 612 may be connected to the series of dummy cells or dummy gates such that the tracking in signal 612 may then return along a tracking out signal 614 path from the dummy cell or dummy gate accessed, rather than from the farthest dummy cell or dummy gate, unless the farthest dummy cell or dummy gate is the dummy cell or dummy gate accessed. By using a memory tracking system 600 that returns a tracking in signal 612 along a tracking out signal 614 path from the dummy cell or dummy gate accessed, the timing of the tracking signals, i.e., tracking in signal 612 and tracking out signal 614 from the control 606 through the wordline tracking circuitry 610 and back to the control 606 may be adjusted dynamically to better estimate access time of a memory cell or gate. A dynamic tracking scheme may provide tracking that depends on the row being accessed rather than depending on the worst case delay for a memory cell or gate having a longest path for a farthest row that may be accessed. For example, the dynamic tracking scheme may depend on the length to the row being accessed rather than the longest path. For FIG. 6, tracking may be faster for closer cells, e.g., on the left and slower for more distant cells, e.g., on the right (e.g., when FIG. 6 viewed with the text, other than the text in the header, is oriented to be read left-to-right). Similarly, for FIG. 7, discussed below, tracking may be faster for closer cells, e.g., lower rows and slower for more distant cells, e.g., higher rows (e.g., when FIG. 7 viewed with the text, other than the text in the header, is oriented to be read left-to-right).

Additionally, in an example, the precharges for bitlines and/or sense amplifiers may be discharged only as low as needed for the particular memory access (or closer to only as low as necessary) because of the reduced time that the wordlines are active. Accordingly, in addition to completing memory accesses more quickly for gates/cells that are closer to the control 606, the dynamic tracking scheme may result in power savings because less current may be required to restore the bitlines and sense amplifiers after accessing the memory. When more time is used to access memory cells or memory gates, voltages on the bitlines and/or sense amplifiers may have more time to decrease in voltage and, accordingly, may decrease lower in voltage. Additionally, the further the voltages drop at the bitlines and/or sense amplifiers the longer time and the more current that may be required to restore the bitlines and sense amplifiers, e.g., to a precharged state.

In some examples, a dynamic tracking scheme may perform the same operation and may provide similar yield as non-dynamic tracking schemes. Additionally, the dynamic tracking scheme may reduce the operating period of some cells of the memory, e.g., the memory access time for some of the cells of the memory, and relax timing requirements for cells in the memory due to faster tracking for rows closer to the controller driving the wordlines. The dynamic tracking scheme operation may finish faster, e.g., for cells/gates that are closer to the control 606. Additionally, the timing may be reduced for some address combinations, e.g., for addresses that correspond to cells/gates that are physically closer to the control 606. In some examples, the dynamic tracking scheme may be used for "self-timed" memories. A self-timed memory may be a memory that begins a read or a write access with a rising edge of an external clock signal, but times events needed for the rest of the read or write cycle internally before the next rising clock edge. The systems and methods described herein may use a dynamic tracking signal, for example, to generate one or more of the internal timing signals that may be used with a self-timed memory.

In the example of FIG. 6, a decoder may make a connection to a return path, e.g., at 616, 618. A delay of a signal may depend on a row being decoded. Accordingly, the example illustrated in FIG. 6 may provide closer tracking of wordline delay. Rows closer to the control 606 may have a faster tracking signal, e.g., due to shorter return paths. Rows farther from the control 606 may have a longer tracking signal, e.g., due to longer return paths.

The tracking out signal 614 may be an inverted or buffered version of the tracking in signal 612. In some examples, the control 606 may maintain an active wordline signal from the time that the tracking in signal 612 is activated to the time the tracking out signal 614 is received. For example, when an inverted is used to buffer between the tracking in signal 612 and the tracking out signal 614, the tracking in signal 612 and the wordline may be inactive initially. The tracking out signal 614 may also be inactive initially (but the polarity of the inactive tracking signal may be opposite the polarity of the inactive tracking in signal due to the use of the inverter). In some examples, the tracking in signal 612 and the wordline may be driven active at the same time. After some time, which may correspond to a time for the tracking in signal 612 to reach the gates or cells being accessed, the tracking signal may be buffered by an inverter. The inverter may drive the tracking out signal 614 active. The inverter may be located proximal to the gates or cells being accessed. A different inverter may be used with each set of gates or cells being accessed along the signal path of the tracking in signal 612. Accordingly, the length of time for the tracking in signal 612 to transit the signal path, propagate through the particular inverter and transit the signal path for the tracking out signal 614 may vary depending on the particular gates or cells being accessed. In some examples, individual gates or cells may use a particular signal path length, i.e., a portion of the tracking in signal 612 path an inverter, and a portion of the tracking out signal 614 path. In some examples, a number of gates or cells making up an individual word may use a particular signal path length. In other examples, a number of gates or cells making up a set of individual words may use a particular signal path length. In other words, different path lengths may be grouped together, e.g., based on the longest path length in the group. In an aspect, path lengths having similar lengths may be grouped together.

After some time, the active state tracking out signal 614 may reach the control 606. The tracking out signal 614 provides feedback that the wordline has reached the cells or gates being addressed. The feedback is modified dynamically based on the path length to the cells or gates being accessed. When the active state tracking out signal 614 reaches the control 606, the control 606 may drive the wordline and the tracking in 612 signal inactive.

As discussed with respect to FIG. 4, in other examples, the wordline and tracking in signal may be active when the wordline and tracking in signal are logic lows. The tracking out signal may be active when a logic high. In another example, a non-inverting buffer may be used to buffer the tracking in signal. Accordingly, the tracking in signal and the tracking out signal may both share the same active logic state, e.g., both logic high or both logic low.

As discussed above, in some examples, the timing between the tracking in signal and the wordline signals may be the same or approximately the same. For example, the tracking in signal and the wordline may be driven active to logic highs at the same time. In other examples, the timing between the tracking in signal and the wordline signals may vary. For example, the wordline signal may be driven active first to help insure the wordline signal meets timing requirements before being disabled based on the tracking circuitry. In other examples, the tracking in signal may precede the wordline to adjust the return of the tracking out signal to correspond to the wordline signal reaching the cells or gates that the cell or gate drives to access a memory cell or cells.

FIG. 7 is a circuit diagram illustrating an aspect of the example memory tracking system of FIG. 6. The example memory tracking system includes wordline tracking circuitry 610 and control 606. The example memory tracking system also includes a series of dummy gates 702, 704, a series of switches 706, and a series of inverters 708.

The example circuit diagram includes a tracking in signal 612 and a tracking out signal 614. The example memory tracking system illustrated in the circuit diagram routes the tracking in signal 612 to the series of switches 706 adjacent to dummy gates 702, 704. The switches 706-1, 706-2, 706-3 connect points along the tracking in signal 612 signal path to the series of inverters 708-1, 708-2, 708-3. Accordingly, each inverter 708-1, 708-2, 708-3 may be connected to a point adjacent to one of the dummy gates 702, 704 (a dummy gate is not shown illustrated for inverter 708-2). At each point, the tracking in signal 612 may be buffered by an inverter 708-1, 708-2, 708-3 based on the state of the corresponding switch 706-1, 706-2, 706-3 connected to the corresponding inverter 708-1, 708-2, 708-3. The particular switch 706-1, 706-2, 706-3 may be activated based on which dummy gate 702, 704, or dummy memory cell is being addressed. For example, if dummy gate 704 is addressed, e.g., along with one or more memory gates or memory cells located a similar distance along a corresponding wordline, the switch 706-1 that is adjacent dummy gate 704 may be turned on and the corresponding inverter 708-1 may buffer the tracking in signal 612 and generate an inverted version of the tracking in signal 612 as the tracking out signal 614. Accordingly, the signal path may be shorter when compared to, for example, a signal path through switch 706-3 and inverter 708-3. Accordingly, the includes wordline tracking circuitry 610 may be used to dynamically track wordlines based on the gate/cell addressed. The tracking out signal 614 may be returned to a control 606. The signal path through switch 706-2 and inverter 708-2 may be used when dummy gate 702 and the corresponding gates/cells are accessed.

In an example, a decoder may make a connection to a return path. Delay of a signal may depend on a row being decoded. The example illustrated in FIGS. 6-7 may provide closer tracking of wordline delay. Lower/left rows may have a faster tracking signal, e.g., due to shorter return paths. Higher/right rows may have a longer tracking signal, e.g., due to longer return paths.

Figure 8:
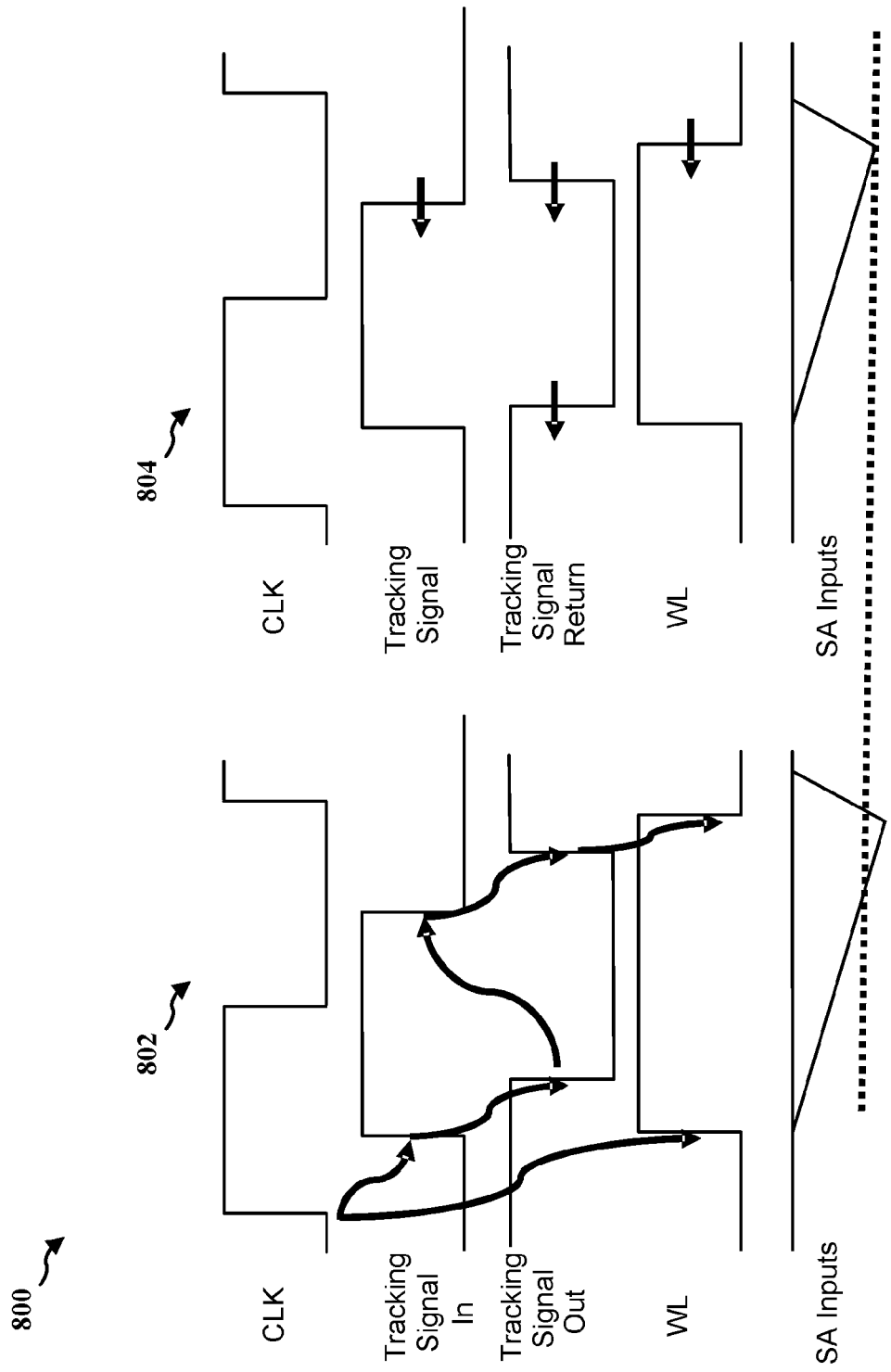
FIG. 8 is a graph illustrating a plurality of exemplary waveforms related to memory tracking systems.

FIG. 8 is a graph illustrating a plurality of exemplary waveforms related to memory tracking systems. The example timing diagrams are for an example non-dynamic (e.g., worst case based) tracking scheme 802 and a dynamic tracking scheme 804 according to an aspect. As a closer, e.g., lower, row is accessed, some tracking schemes track a differential bit line voltage (DVBL) developed at a farthest, e.g., highest, row. It may be the DVBL developed at a farthest row that is fed back, e.g., through a buffer or inverter. Accordingly, in the illustrated example, a rising edge on the clock (CLK) leads to a rising edge on the tracking signal in and the wordline (WL). The rising edge on the tracking signal in leads to a falling edge on the tracking signal out, e.g., due to the inverter used as a buffer. The falling edge of the tracking signal return, e.g., received at the control 406 after a delay, causes the control 406 to cause a falling edge on the tracking signal in, which leads to a rising edge on tracking signal out and the wordline (WL). The falling edge on the wordline (WL) leads to an end to the falling precharged inputs, e.g., discharging bitlines and sense amplifiers. It will be understood that the example of FIG. 8 is active high tracking in and wordline (WL), and active low tracking signal out, with an inverter acting as a buffer. Other examples are possible, as described above.

A dynamic tracking scheme 804 may track an exact row accessed or groups of rows. The tracking may be accomplished using dummy buffers to simulate a delay of certain memory cells which are grouped together based on similar path lengths. The groups of cells may make up a single row or groups of rows. Groups of rows being tracked together may generally be rows adjacent to each other. The dummy cell and corresponding memory cell may be accessed based on the bitline used to access a particular memory address. A set of switches and inverters may be controlled by the bitlines. For example, each bitline may control a switch. The tracking signal may be fed back through the switch selected by the bitline and through the corresponding inverter (or buffer). Accordingly, the bitlines may select how long the feedback path is for feedback path, e.g., the wordline $WL^{2n+1}$. Again, a rising edge on the clock (CLK) leads to a rising edge on the tracking signal in and the wordline (WL). The rising edge on the tracking signal in leads to a falling edge on the tracking signal out, e.g., due to the inverter used as a buffer. The falling edge of the tracking signal return, e.g., received at the control 606 after a delay, causes the control 606 to cause a falling edge on the tracking signal in, which leads to a rising edge on tracking signal out and the wordline (WL). The falling edge on the wordline (WL) leads to an end to the falling precharged signals, e.g., discharging bitlines and sense amplifiers.

In the dynamic tracking scheme 804, however, the wordline (WL) pulse width may narrow as a result of the lower delay of the tracking signal in, inverter (or buffer), and tracking signal out signal. The differential bit line voltage requirement of a precharged signal may still be met, e.g., because the precharged signals may not decrease as far for many memory accesses using dynamic tracking because the accesses for many bitcells are shorter than the worst case access timing. In some examples, a power savings for precharged signals may increase the number of input/outputs (I/O's) possible in a system because each I/O might require less pre-charge current to restore the bitline and the sense amplifier, and accordingly, more I/O may be possible for a given amount of current.

Again, as described above, it will be understood that the example of FIG. 8 is active high tracking in and wordline (WL), and active low tracking signal out, with an inverter acting as a buffer. Other examples are possible, as described above.

As described herein, non-dynamic compiler memory tracking may mimic worst case bitcell access. Such a tracking scheme may consume more power than necessary to precharge bitlines and sense amplifiers after a memory access. In an aspect, a dynamic tracking scheme that depends on bitcell location may be used. Precharge voltages for bitlines and sense amplifiers may not be discharged as low, as compared to non-dynamic compiler memory tracking systems that mimic worst case bitcell access because bitcell accesses may be sorter for most bitcells, e.g., except the bitcells furthest down the wordline. A dynamic tracking scheme may result in power savings because less current may be required to restore precharges for bitlines and sense amplifiers. In some aspects, an memory access period may be reduced and timing for memory accesses relaxed, e.g., lowered for closer bitcells. Additionally, dynamic tracking may be used for self-timed memories.

Figure 9:
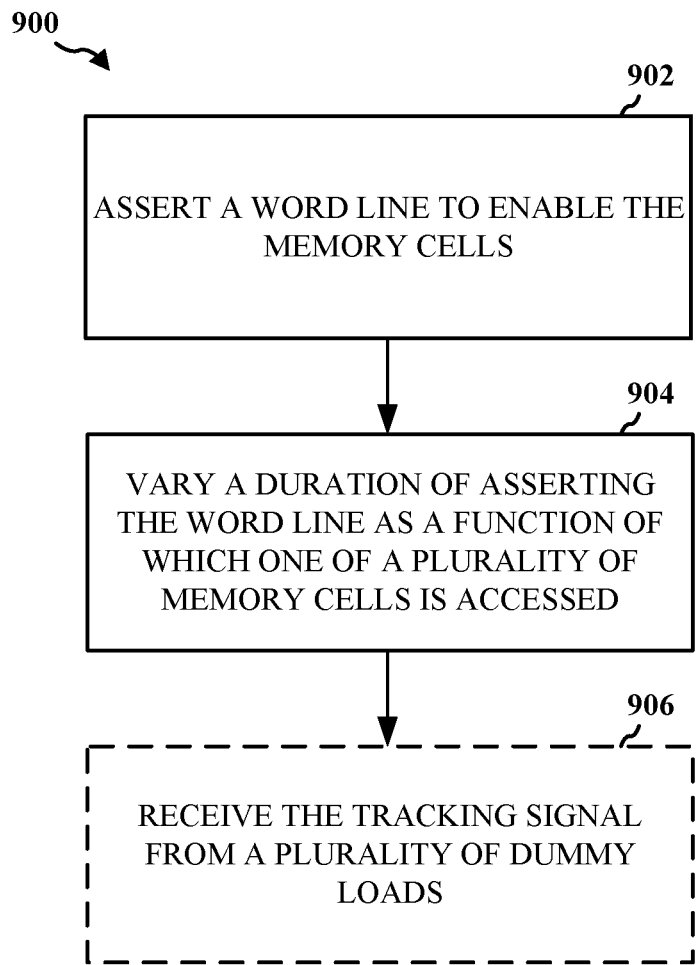
FIG. 9 is a flowchart of one example of a method of using a memory.

FIG. 9 is a flowchart 900 of one example of a method of using a memory. At a block 902, an apparatus implementing the method asserts a wordline to enable the memory cells (e.g., all memory cells making up a word). For example, in the method 900, the controller 606 implementing the method asserts a wordline (WL1 . . . WL$2^{n+1}$) to enable the memory cell, e.g., memory cell 214, corresponding dummy memory cell 224. The wordline (WL$2^{n+1}$, tracking signals 612, 614) may act as a tracking signal.

At a block 904, in the method 900 of a memory an apparatus implementing the method varies a duration of asserting the wordline (WL$2^{n+1}$) as a function of which memory cell of a plurality of memory (dummy memory cell 224) cells is accessed. For example, the controller 606 implementing the method varies a duration of asserting the wordline (WL$2^{n+1}$, tracking signals 612, 614) as a function of which one of a plurality of memory cells (dummy memory cells 224, dummy gates 702, 704) is accessed. Varying the duration of asserting the wordline (WL$2^{n+1}$, 6) may include varying the duration of asserting the wordline as a function of a delayed tracking signal (tracking in 610, tracking out 612). The dummy memory cell may be used to estimate a duration for a wordline that may be used to access multiple bits, e.g., a word. For example, referring back to FIG. 2, a single dummy memory cell may be equidistant along wordline WL$2^{n+1}$ as multiple memory cells that may, together, store words of data.

In an example, as described above, the wordline tracking circuitry 222 illustrated in FIG. 2 may connect to a series of dummy memory cells 224. The dummy memory cells 224 may run along the length of a wordline tracking signal line. The wordline tracking circuitry 222 may include a wordline tracking signal line, one or more switches, one or more inverters and a wordline tracking signal return line. The wordline tracking signal line is coupled to the one or more switches. The one or more switches are each coupled to one of the one or more inverters. The output of the one or more inverters are coupled to the wordline tracking signal return line. The wordline tracking circuitry 222 may provide a dynamic tracking scheme that may provide tracking that depends on the row being access rather than depending on the worst case. For example, the dynamic tracking scheme may depend on the length of the row being accessed rather than tracking the longest path.

At a block 906, the method 900 indicates that an apparatus receives the tracking signal from a plurality of dummy loads spaced apart along the transmission line and outputs the delayed tracking signal. For example, the controller 606 receives the tracking signal (tracking out 612) from a plurality of dummy loads (dummy memory cell 224, dummy gates 702, 704) spaced apart along the transmission line (at tracking signal out 612) and outputs the delayed tracking signal (tracking signal out). The tracking signal in 610 may be fed back through a switch 706 and buffered by an inverter 708 to form a variable length signal path from the controller, out to the dummy gates 702, 706, and back to the controller.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

A memory (104) may include a memory array having a plurality of memory cells (214, 216). The memory (104) may include an address decoder (row decoder 204) configured to assert a wordline to enable the memory cells (214, 216). The memory (104) includes a tracking circuit (222, 610) configured to vary a duration of the asserted wordline as a function of which memory cell of the plurality of memory cells is accessed.

In an example memory, the tracking circuit (222, 610) may include a variable delay circuit (e.g., tracking in signal 612; tracking out signal 614; dummy gates 702, 704; switches 706; and inverters 708) configured to vary a delay of a tracking signal as a function of said memory cell (702, 704) of the plurality of memory cells is accessed. The tracking circuit (222, 610) is further configured to vary the duration of the asserted wordline as a function of the delayed tracking signal.

In an example memory, the variable delay circuit may include a transmission line (tracking in signal 612 and tracking out signal 614) configured to receive the tracking signal, a plurality of dummy loads (dummy cells 224; dummy gates 702, 704) spaced apart along the transmission line (tracking in signal 612 and tracking out signal 614), and a bypass circuit (switches 706; and inverters 708) configured to output the delayed tracking signal. Additionally, the bypass circuit may be switchable (switches 706) to bypass one or more of the plurality of dummy loads (dummy cells 224; dummy gates 702, 704) as a function of said memory cell of the plurality of memory cells accessed.

In an example, each dummy load (dummy gates 702, 704) of the plurality of dummy loads (dummy gates 702, 704) comprises a transistor (dummy gates 702, 704).

In an example, the bypass circuit may include a plurality of bypass switches (switches 706). Each bypass switch (706) of the plurality of bypass switches (706) may be configured to bypass a different number of dummy loads (dummy cells 224; dummy gates 702, 704), the bypass switches (706) bypassed the dummy loads (dummy cells 224; dummy gates 702, 704) as a function of said memory cell (214, 216) of the plurality of memory cells (214, 216) selected.

In an example, the bypass circuit may further include a plurality of logic circuits (e.g., logic to generate the bitline signals that may be used to control the bypass switches 708) Each logic circuit of the plurality of logic circuits may be coupled in series with a corresponding bypass switch (708) of the plurality of bypass switches (708-1, 708-2, 708-3).

An address decoder includes a wordline assertion circuit (row decoder 204) configured to assert a wordline to enable the memory cells (214, 216). The address decoder also includes a tracking circuit (222, 610). The tracking circuit (222, 610) is coupled to the wordline assertion circuit (204) and configured to vary a duration of the asserted wordline as a function of which memory cell (214, 216) of the plurality of memory cells (214, 216) is accessed.

A processing system includes, at least one processor (102) and a memory array (104) coupled to the at least one processor (102). The memory array (104) may have a plurality of memory cells (214, 216). The processing system includes an address decoder (including row decoder 204) configured to assert a wordline to enable the memory cells. Additionally, the processing system includes a tracking circuit (222, 610) configured to vary a duration of the asserted wordline as a function of which memory cell (214, 216) of the plurality of memory cells (214, 216) is accessed.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A memory, comprising:
   a memory array having a plurality of memory cells;
   an address decoder configured to assert a wordline to enable the memory cells; and
   a tracking circuit configured to vary a duration of asserting the wordline as a function of a path length to a memory cell in a row of memory cells of the plurality of memory cells that is accessed, the tracking circuit comprises a variable delay circuit configured to vary a delay of a tracking signal as a function of said memory cell of the plurality of memory cells being accessed, and wherein the tracking circuit is further configured to vary the duration of asserting the wordline as a function of the delayed tracking signal, and the variable delay circuit comprises a transmission line configured to receive the tracking signal, a plurality of dummy loads spaced apart along the transmission line, and a bypass circuit configured to output the delayed tracking signal, the bypass circuit being switchable to bypass one or more of the plurality of dummy loads as a function of said memory cell of the plurality of memory cells accessed.

2. The memory of claim 1, wherein each dummy load of the plurality of dummy loads comprises a transistor.

3. The memory of claim 1, wherein the bypass circuit comprises a plurality of bypass switches, each bypass switch of the plurality of bypass switches being configured to bypass a different number of dummy loads, and wherein the bypass switches bypassed the dummy loads as a function of said memory cell of the plurality of memory cells selected.

4. The memory of claim 3, wherein the bypass circuit further comprises a plurality of logic circuits, each logic circuit of the plurality of logic circuits being coupled in series with a corresponding bypass switch of the plurality of bypass switches.

5. An address decoder, comprising:
   a wordline assertion circuit configured to assert a wordline to enable a plurality of memory cells; and
   a tracking circuit, coupled to the wordline assertion circuit and configured to vary a duration of asserting the wordline as a function of a path length to a memory cell in a row of memory cells of the plurality of memory cells that is accessed, tracking circuit comprising a variable delay circuit configured to vary a delay of a tracking signal as a function of said memory cell of the plurality of memory cells is accessed, and wherein the tracking circuit is further configured to vary the duration of asserting the wordline as a function of the delayed tracking signal, the variable delay circuit comprising a transmission line configured to receive the tracking signal, a plurality of dummy loads spaced apart along the transmission line, and a bypass circuit configured to output the delayed tracking signal, the bypass circuit being switchable to bypass one or more of the plurality of dummy loads as a function of said memory cell of the plurality of memory cells accessed.

6. The address decoder of claim 5, wherein each dummy load of the plurality of dummy loads comprises a transistor.

7. The address decoder of claim 5, wherein the bypass circuit comprises a plurality of bypass switches, each bypass switch of the plurality of bypass switches being configured to bypass a different number of dummy loads, and wherein the bypass switches bypassed the dummy loads as a function of said memory cell of the plurality of memory cells selected.

8. The address decoder of claim 7, wherein the bypass circuit further comprises a plurality of logic circuits, each logic circuit of the plurality of logic circuits being coupled in series with a corresponding bypass switch of the plurality of bypass switches.

9. A processing system, comprising:
   at least one processor;
   a memory array coupled to the at least one processor, the memory array having a plurality of memory cells;
   an address decoder configured to assert a wordline to enable the memory cells; and
   a tracking circuit configured to vary a duration of asserting the wordline as a function of a path length to a memory cell in a row of memory cells of the plurality of memory cells that is accessed, the tracking circuit comprising a variable delay circuit configured to vary a delay of a tracking signal as a function of said memory cell of the plurality of memory cells being accessed, and wherein the tracking circuit is further configured to vary the duration of asserting the wordline as a function of the delayed tracking signal, the variable delay circuit comprising a transmission line configured to receive the tracking signal, a plurality of dummy loads spaced apart along the transmission line, and a bypass circuit configured to output the delayed tracking signal, the bypass circuit being switchable to bypass one or more of the plurality of dummy loads as a function of said memory cell of the plurality of memory cells accessed.

10. The processing system of claim 9, wherein each dummy load of the plurality of dummy loads comprises a transistor.

11. The processing system of claim 9, wherein the bypass circuit comprises a plurality of bypass switches, each bypass switch of the plurality of bypass switches being configured to bypass a different number of dummy loads, and wherein the bypass switches bypassed the dummy loads as a function of said memory cell of the plurality of memory cells selected.

12. The processing system of claim 11, wherein the bypass circuit further comprises a plurality of logic circuits, each logic circuit of the plurality of logic circuits being coupled in series with a corresponding bypass switch of the plurality of bypass switches.

13. A method to use a memory, comprising:

asserting a wordline to enable a plurality of memory cells in a row of memory cells within the memory, the memory including a tracking circuit comprising a variable delay circuit, the variable delay circuit including a transmission line; and varying a duration of asserting the wordline as a function of a path length to a memory cell in a row of memory cells of the plurality of memory cells that is accessed, wherein varying the duration of the asserted wordline comprises varying the duration of asserting the wordline as a function of a delayed tracking signal and receiving the delayed tracking signal from a plurality of dummy loads spaced apart along the transmission line and outputting the delayed tracking signal.

* * * * *